United States Patent
Huang

(10) Patent No.: US 7,319,226 B2
(45) Date of Patent: Jan. 15, 2008

(54) CAMERA APPARATUS WITH INFRARED NIGHT VISION CHARGE COUPLED DEVICE

(76) Inventor: Kun-Lieh Huang, No. 12, Yishou 1st St., Taoyuan City, Taoyuan County 33056 (TW)

( * ) Notice: Subject to any disclaimer, the term of this patent is extended or adjusted under 35 U.S.C. 154(b) by 0 days.

(21) Appl. No.: 11/044,927

(22) Filed: Jan. 26, 2005

(65) Prior Publication Data

US 2006/0163481 A1    Jul. 27, 2006

(51) Int. Cl.
*G01J 5/00* (2006.01)
(52) U.S. Cl. .................................................. 250/330
(58) Field of Classification Search .......... 250/DIG. 1, 250/330
See application file for complete search history.

(56) References Cited

U.S. PATENT DOCUMENTS 4,087,688 A * 5/1978 Keller ......................... 250/342
6,812,970 B1 * 11/2004 McBride ...................... 348/372
2005/0146641 A1 * 7/2005 Cheng .......................... 348/373

* cited by examiner

*Primary Examiner*—Constantine Hannaher
(74) *Attorney, Agent, or Firm*—Pro-Techtor Int'l Services

(57) ABSTRACT

An infrared night vision camera apparatus includes a casing unit delimiting a first compartment and a second compartment separated from the first compartment, a light source module mounted in the first compartment, a shooting module mounted in the first compartment, and a power supply unit mounted in the second compartment. The casing unit further includes a through-hole for communicating the first compartment with the second compartment. The power supply unit includes a power line and a signal line extending through the through-hole. The power line is electrically connected and supplies power to the light source module and the shooting module. The signal line is electrically connected to the shooting module. Heat generated by the power supply unit and moisture in the second compartment are prevented from entering the first compartment.

18 Claims, 9 Drawing Sheets

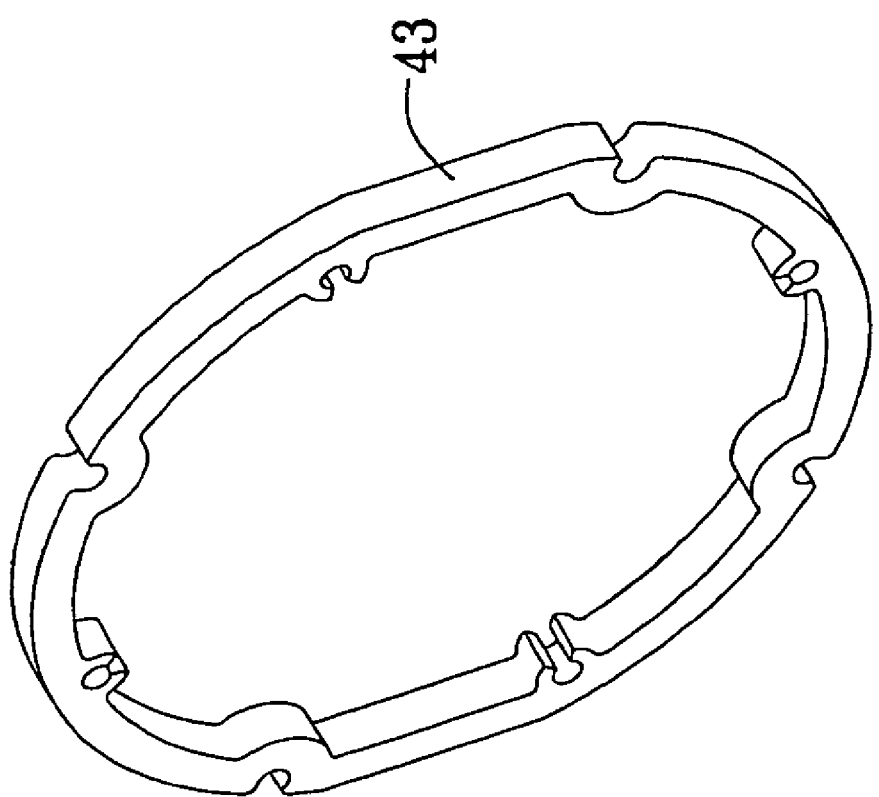

CAMERA APPARATUS WITH INFRARED NIGHT VISION CHARGE COUPLED DEVICE

BACKGROUND OF THE INVENTION

1. Field of the Invention

The present invention relates to a camera apparatus. In particular, the present invention relates to a camera apparatus with an infrared night vision charge coupled device.

2. Description of the Related Art

FIG. 1 shows a conventional camera apparatus with an infrared night vision charge coupled device. FIG. 2 is a sectional view of the conventional camera apparatus in FIG. 1. The conventional camera apparatus 1 comprises a casing 11, a substantially L-shaped aluminum plate 12 mounted in the casing 11, a light source module 13 mounted on the aluminum plate 12, a shooting module 14 mounted on the aluminum plate 12, and a power supply unit 15 mounted on the aluminum plate 12.

The casing 11 comprises a cylindrical body 111, a fixing ring 112 mounted to a front end of the body 111, a rear cap 113 mounted to a rear end of the body 111, and a transparent glass 115. A rubber gasket or washer 114 is sandwiched between the transparent glass 115 and the fixing ring 112, and another rubber gasket or washer 14 is sandwiched between the rear end of the body 111 and the rear cap 113.

The rear cap 113 includes two through-holes 116 each having an inner threading for threadedly engaging with an outer threading of a coupler 117. Each coupler 117 is covered by a waterproof plastic film (not shown) and screwed to the rear cap 113. However, the waterproof effect between the coupler 117 and the associated through-hole 116 is not satisfactory.

The aluminum plate 12 includes a horizontal section 121 and an upright section 122 extending from the horizontal section 121. The light source module 13 includes an infrared board 131, a plurality of light-emitting diodes (LEDs) 132, and a photosensitive resistor 133. The shooting module 14 includes a charge coupled device circuit board 141 and a lens 142 that is mounted in a central portion of the charge coupled device circuit board 141 and that extends through the vertical section 122 and the infrared board 131 in sequence.

In assembly, the infrared board 131 of the light source module 13 is screwed to two copper pegs 123 on a side of the vertical section 122. The charge coupled device circuit board 141 of the shooting module 14 is screwed to four studs 124 on the other side of the vertical section 122.

The power supply unit 15 includes a transformer 151, an alternating-current power line 152 that is connected between a power source (not shown) and the transformer 151 on the charge coupled device circuit board 141 and that extends through one of the couplers 117 in the associated through-hole 116, and a signal output line 153 that is connected between the charge coupled device circuit board 141 and an electric device (not shown) and that extends through the other couple 117 in the associated through-hole 116. Thus, the alternating-current power line 152 and the signal output line 153 respectively extend through the through-holes 116, preventing the signal output line 153 from being interfered by the alternating-current power line 152. In a case that the environment is not bright enough for shooting, the light source module 13 is activated by the photosensitive resistor 133 to provide additional illumination for shooting purposes. Thus, the shooting module 14 may proceed with shooting even in the night or a dark place.

Since the camera apparatus 1, especially an infrared night vision camera, is usually mounted outdoors for monitoring purposes, the camera apparatus 1 must be completely waterproof. The camera apparatus 1 is often mounted in a high location and inclines forward for shooting downward. However, the transparent glass 115 becomes foggy in the dawn, a rainy day, or foggy hours, the image is thus vague. The camera apparatus 1 must be detached in a case that the moisture cannot be expelled. The waterproof effect is one of the most important issues of the camera apparatus 1.

The fixing ring 112 and the body 111 however have a poor waterproof effect therebetween, as a gap exists between the fixing ring 112 and the body 111 due to the arrangement of the rubber washer 114 and bolts 118 for fixing the fixing ring 112 and the rubber washer 114. The same situation exists between the rear cap 113 and the associated rubber washer 114. Further, since the camera apparatus 1 inclines forward, the water flows easily along the alternating-current power line 152 and the signal output line 153 into the through-holes 116 as well as the casing 11. Also, water may flow via the gaps between the couplers 117 and the rear cap 113, as the couplers 117 are not integrally formed with the rear cap 113 and thus have a poor waterproof effect. Further, the plug for the alternating-current power line 152 and the plug for the signal output line 153 may also be problems, as these plugs are not treated for waterproof purposes, resulting in easy penetration of water into the casing 11. In a case that water enters the power supply unit 15 along the alternating-current power line 152 and/or the signal output line 153, the charge coupled device circuit board 141 and the circuit board of the power supply unit 15 are liable to be damaged.

A further problem of the camera apparatus 1 is heat dissipation. The LEDs 132 and the electronic elements such as drive transistors (not shown), current limiting resistors (not shown), etc on the infrared board 131 generate a considerable amount of heat that are transmitted via the pins of the LEDs 132 or the electronic elements to the infrared board 131. Since the casing 11 is sealed and since the infrared board 131 is made of glassfiber having a poor thermal conductivity, only a small amount of heat is dissipated through the copper pegs 123 to the vertical section 122 of the aluminum plate 12, resulting in high temperature while the light source module 13 is working.

The power supply unit 15 also generates heat while working, which may adversely affect the LEDs 132, the charge coupled device circuit board 141, and the lens 142 having high precision, leading to burning out of the LEDs 132 in a short time, deterioration of precision of the charge coupled device circuit board 141 and the lens, shortening of the life, and malfunctioning of the camera apparatus 1. Also, the heat generated by the light source module 13 adversely affects the function of the power supply unit 15.

In a case of maintenance or repair due to malfunction of any one of the light source module 13, the shooting module 14, and the power supply module 15 is required, the rear cap 113 has to be detached and the aluminum plate 12 is then removed. The power supply unit 15 however malfunctions easily, and the repair is troublesome. Further, the waterproof effect between the rear cap 113 and the body 111 deteriorates every time the rear cap 113 is detached. The ambient moisture enters the casing 11 easily and causes the transparent glass 115 to become foggy, which definitely occurs when the light source module 13 (that may include up to 84 LEDs) generate high heat. The image is thus vague. Repair is inevitable, and what is worse, the charge coupled device is liable to be burned out.

SUMMARY OF THE INVENTION

An objective of the present invention is to provide a camera apparatus that reduces the possibility of burning out of the LEDs.

Another objective of the present invention is to provide a camera apparatus that reduces deterioration and malfunction of the charge coupled device.

A further objective of the present invention is to provide a camera apparatus that provides an improved waterproof effect.

Still another objective of the present invention is to provide a camera apparatus that allows easy maintenance and repair of the power supply unit.

Yet another objective of the present invention is to provide a camera apparatus that allows maintenance of the power supply unit without adversely affecting the waterproof structure.

Still another objective of the present invention is to provide a camera apparatus that allows maintenance of the light source module without adversely affecting the waterproof structure.

Yet another objective of the present invention is to provide a camera apparatus that allows maintenance of the shooting module without adversely affecting the waterproof structure.

An infrared night vision camera apparatus comprises a casing unit, a light source module, a shooting module, and a power supply unit. The casing unit comprises a first receiving section delimiting a first compartment and a second receiving section delimiting a second compartment separated from the first compartment. The casing unit further includes a through-hole for communicating the first compartment with the second compartment.

The light source module is mounted in the first compartment and comprises a first circuit board and a plurality of lighting elements mounted on the first circuit board. The shooting module is mounted in the first compartment and includes a second circuit board and a lens that is mounted on the second circuit board and that extends through the first circuit board. The power supply unit is mounted in the second compartment and comprises a power line and a signal line extending through the through-hole. The power line is electrically connected and supplies power to the light source module and the shooting module. The signal line is electrically connected to the shooting module. Heat generated by the power supply unit and moisture in the second compartment are prevented from entering the first compartment.

Preferably, the first circuit board is an infrared board and the lighting elements are light-emitting diodes.

Preferably, the casing unit comprises a partitioning member mounted between the first receiving section and the second receiving section for separating the first compartment from the second compartment, with the through-hole being defined in the partitioning member. The partitioning member comprises a first section and a reduced second section integrally formed on a side of the first section, and the through-hole extends from the first section through the second section.

In an embodiment of the invention, the second receiving section comprises a plurality of longitudinal screw holes. The partitioning member includes a plurality of screw holes aligned with the longitudinal screw holes of the second receiving section. The casing unit further includes a rear cap mounted to a rear end of the second receiving section. A plurality of screws are extended through the rear cap and the longitudinal screw holes of the second receiving section into the screw holes in the partitioning member.

Preferably, the shooting module further comprises a fixing ring securely mounted in the first compartment, and wherein the second circuit board is fixed to the fixing ring. Preferably, the fixing ring has a size correlated to a length of the lens.

The first receiving section may comprise an open front end, and the first receiving section of the casing unit may further comprise a front cap removably attached to the open front end of the first receiving section, with a first waterproof ring being mounted between the front cap and the front end of the first receiving section.

The second receiving section may include an open rear end, and the casing unit may further comprise a rear cap removably attached to the open rear end of the second receiving section.

The first receiving section may comprises a rear end, and the first section of the partitioning member is coupled with the rear end of the first receiving section, with a second waterproof ring being mounted between the rear end of the first receiving section and the first section of the partitioning member.

The front end of the first receiving section may include an outer threaded section, two smooth sections behind the outer threaded section, and an annular groove between the smooth sections for receiving the first waterproof ring. The front cap may include an inner threaded section for threadedly engaging with the outer threaded section of the first receiving section. The front cap may further include a smooth section facing the smooth sections of the front receiving section and pressing against the first waterproof ring.

In another embodiment of the invention, the second receiving section includes a front end with a plurality of radial screw holes. The first section of the partitioning member includes a plurality of radial screw holes. A plurality of screws respectively extend through the radial screw holes of the second receiving section into the radial screw holes of the partitioning member.

In a further embodiment of the invention, the second receiving section includes a front end with an annular inner flange, and the first section of the partitioning member including an annular groove for receiving the annular inner flange.

In still another embodiment of the invention, the second receiving section includes a front end with an inner threading, and the first section of the partitioning member including an outer threading for threadedly engaging with the inner threading of the second receiving section.

In yet another embodiment of the invention, the second receiving section includes a front end face with two hooks, and the first section including a rear side having two slots each having a relatively wider section and a relatively narrower section. Each hook is extendable into the relatively wider section of an associated slot and then moved into the relatively narrower section of the associated slot, thereby fixing the second receiving section to the partitioning member.

Preferably, the through-hole includes an enlarged section in the second section of the partitioning member. A waterproof jacket is mounted in the enlarged section of the through-hole for holding the power line and the signal line. A tightening member has at least a portion sandwiched between the waterproof jacket and a peripheral wall delimiting the enlarged section of the through-hole, imparting a force to securely clamping the power line and the signal line.

Preferably, the second section of the partitioning member includes an outer threaded section. A waterproof nut is coupled with the outer threaded section of the second section of the partitioning member and exerts an inward force to the tightening member.

Preferably, a waterproof sleeve is mounted in a section of the through-hole in the first section of the partitioning member for holding the power line and the signal line.

Preferably, the second receiving section includes a radial hole through which the power line and the signal line extend.

Preferably, the casing unit includes a first casing delimiting the first compartment, a second casing delimiting the second compartment, and a partitioning member mounted between the first casing and the second casing for separating the first compartment from the second compartment. The second casing includes a radial hole through which the power line and the signal line extend.

Other objectives, advantages, and novel features of the invention will become more apparent from the following detailed description when taken in conjunction with the accompanying drawings.

BRIEF DESCRIPTION OF THE DRAWINGS

FIG. 9 is a perspective view of a fixing ring of the camera apparatus in accordance with the present invention.

DETAILED DESCRIPTION OF THE PREFERRED EMBODIMENTS

Figure 1:
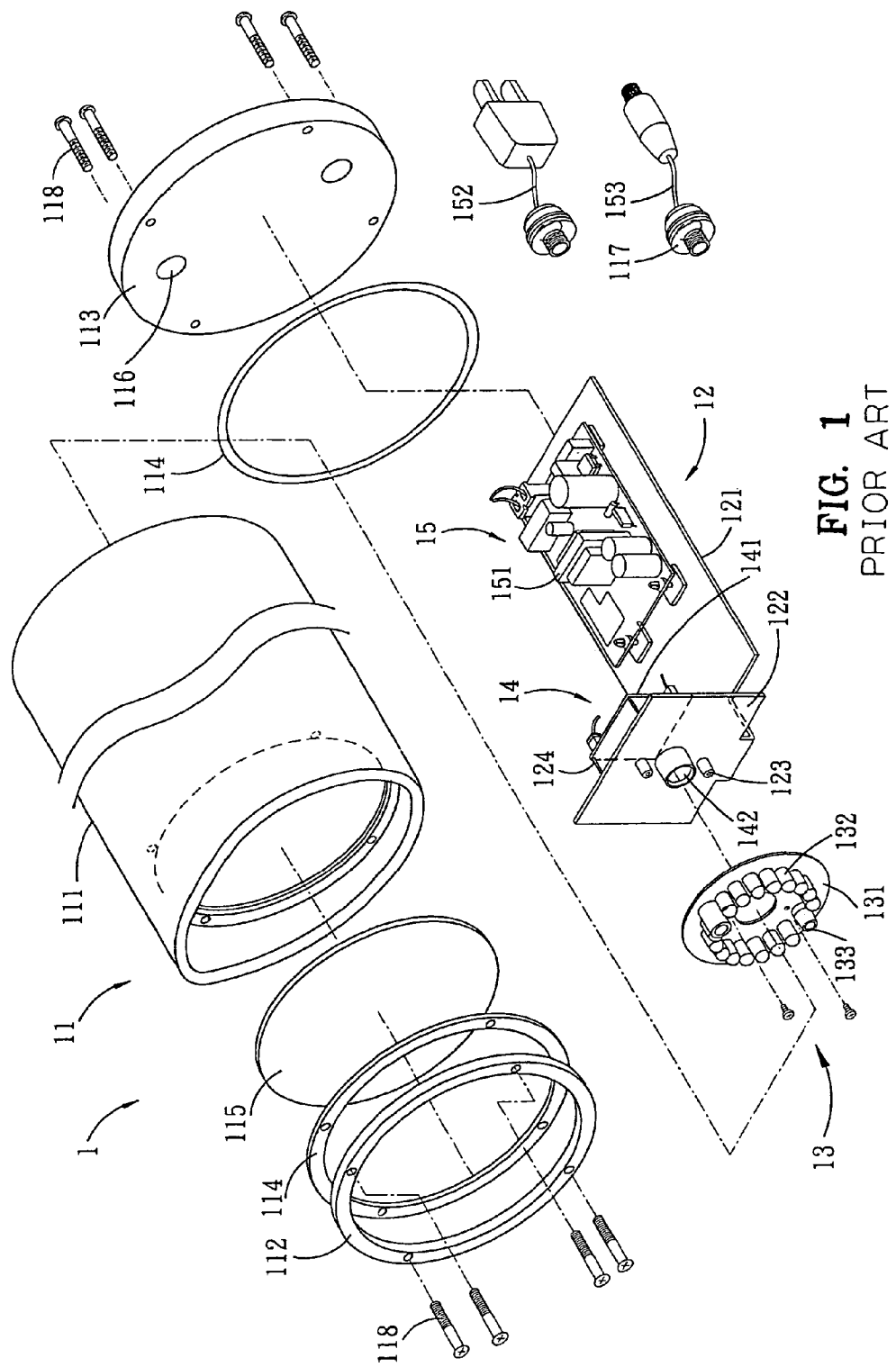
FIG. 1 is an exploded perspective view of a conventional camera apparatus with an infrared night vision charge coupled device.
Figure 2:
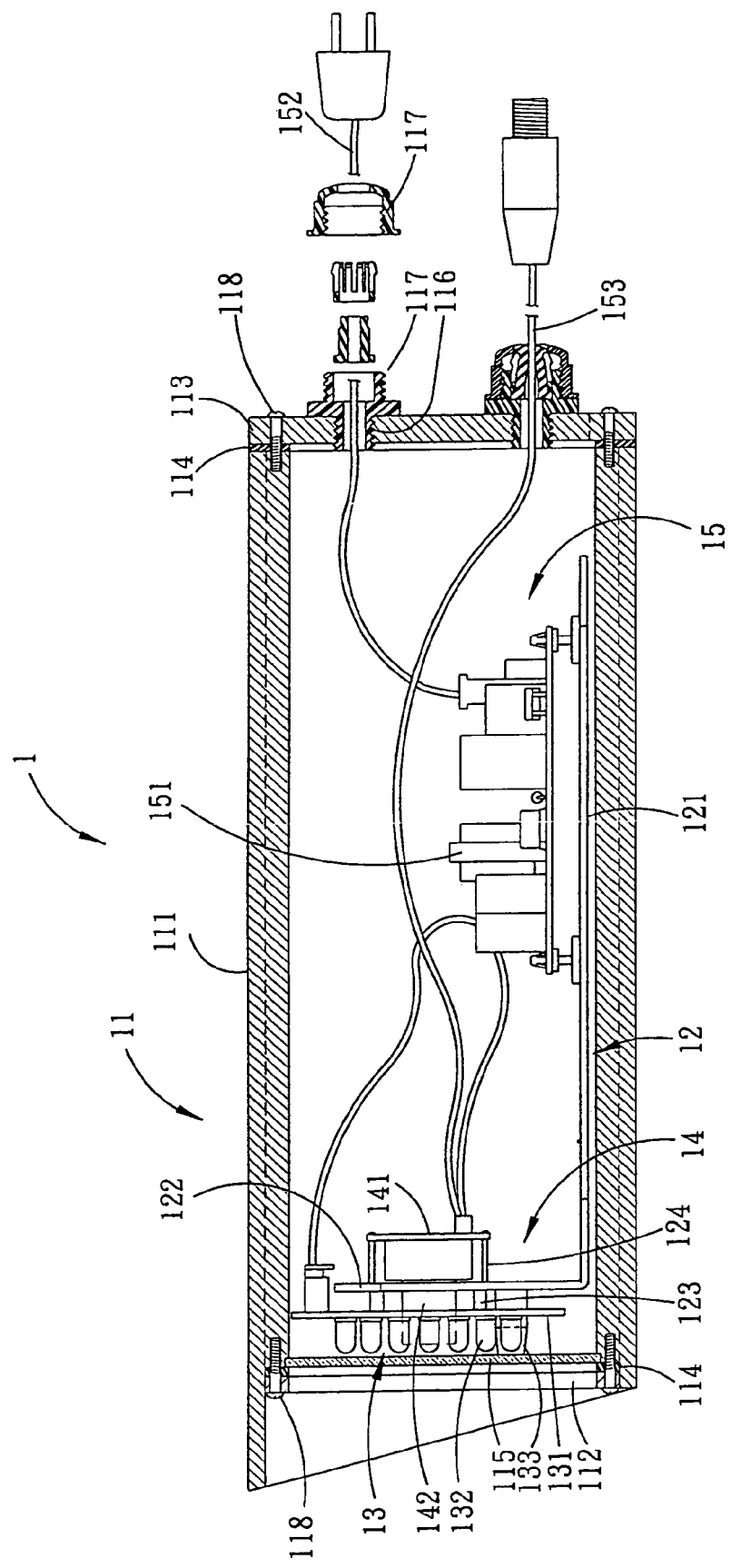
FIG. 2 is a sectional view of the conventional camera apparatus in FIG. 1.
Figure 3:
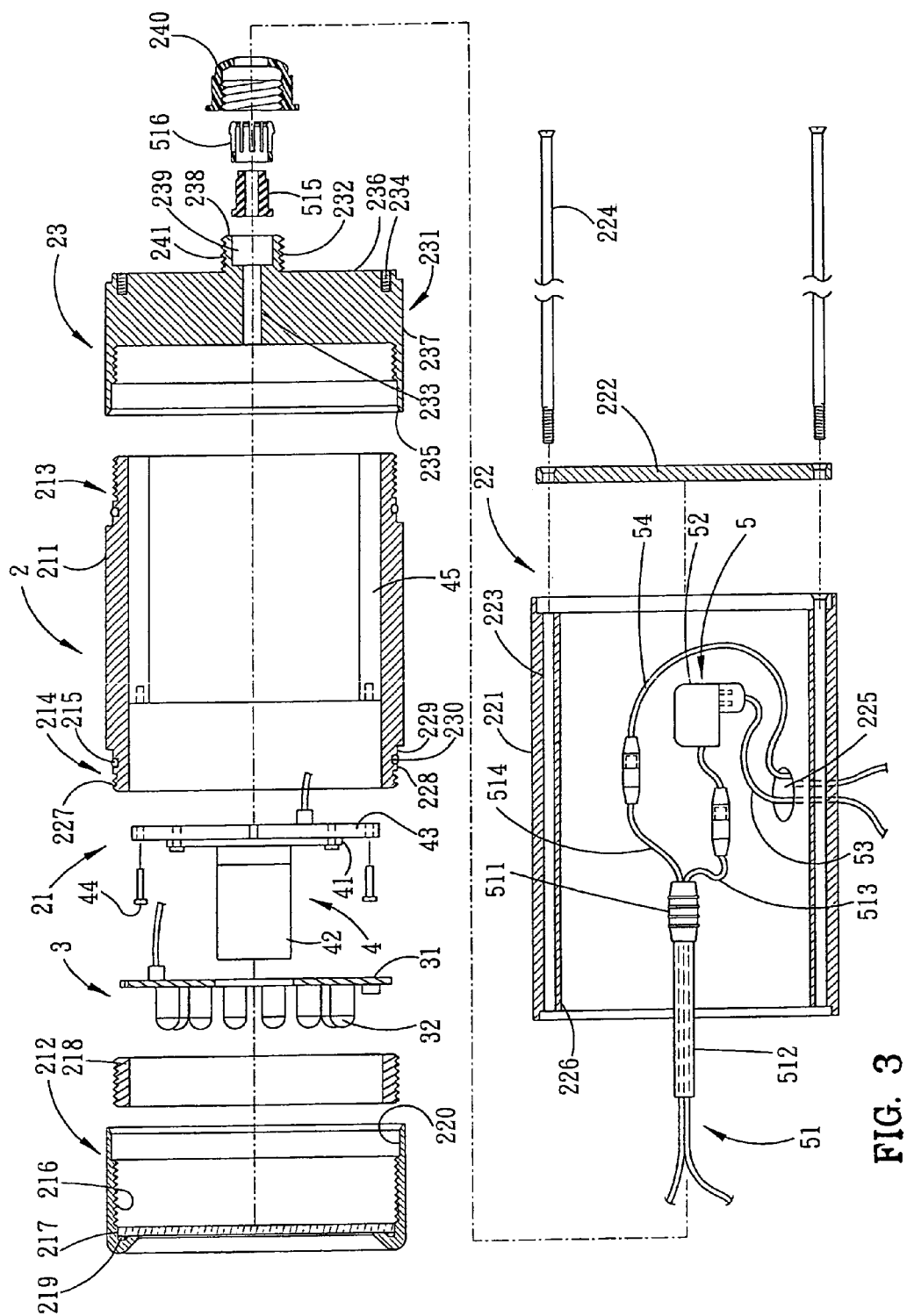
FIG. 3 is an exploded sectional view of a camera apparatus with an infrared night vision charge coupled device in accordance with the present invention.
Figure 4:
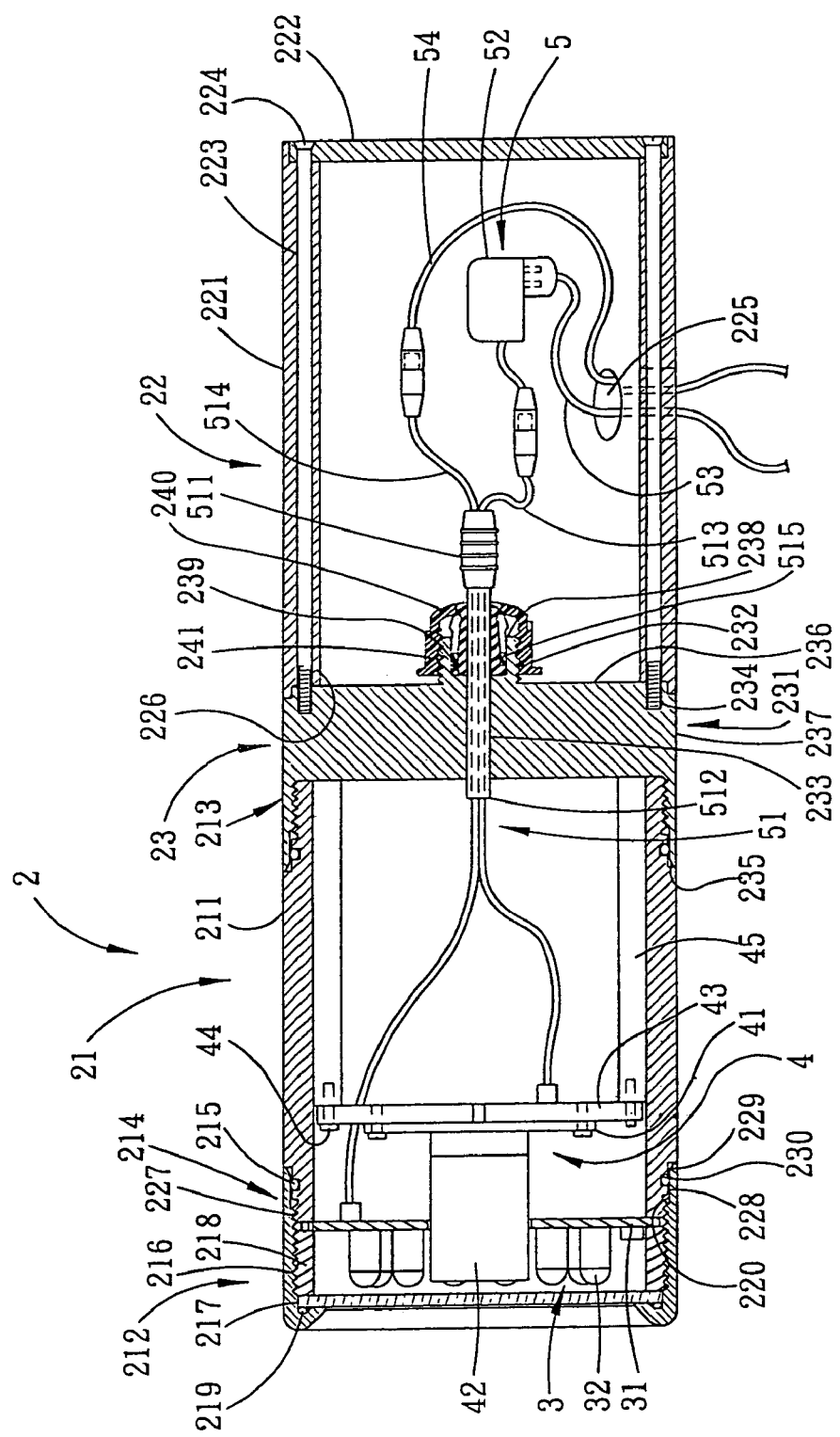
FIG. 4 is a sectional view of the camera in FIG. 3.

Referring to FIGS. 3 and 4, an embodiment of a camera apparatus in accordance with the present invention comprises a casing unit 2, a light source module 3, a shooting module 4, and a power supply unit 5. The casing unit 2 comprises a first receiving section, a second receiving section, and a partitioning member 23 for separating the first casing 21 from the second casing 22. In the illustrated embodiment, the casing unit 2 comprises a first casing 21 that delimits a first compartment and a second casing 22 that delimits a second compartment. The first casing 21 includes a substantially tubular body 211 having a first end (front end) 214 to which a front cap 212 is mounted and a second end (rear end) 213 to which the partitioning member 23 is mounted.

In the illustrated embodiment, each of the first end 214 and the second end 213 of the body 211 includes an outer threaded section to which a waterproof ring 215 is mounted.

The front cap 212 is substantially tubular and includes an inner threaded section 216 for engaging with the outer threaded section of the first end 214 of the body 211. A transparent glass 217 is mounted in a front end of the front cap 212, and a sleeve 218 is mounted in the front cap 212 and threadedly engaged with the inner threaded section 216 of the first end 214 of the body 211. As illustrated in FIG. 4, the transparent glass 217 is retained in place by the sleeve 218. A waterproof washer 219 is mounted in front of the transparent glass 217. More specifically, the waterproof washer 219 is sandwiched between the transparent glass 217 and an end wall (not labeled) of the front end of the front cap 212. The first compartment is defined by the body 211 of the first casing 21, the front cap 212, and the partitioning member 23.

Still referring to FIGS. 3 and 4, the second casing 22 is substantially tubular and comprises an annular wall 221. A plurality of longitudinal holes 223 extending through the annular wall 221 along a longitudinal direction of the annular wall 221 and spaced from one another. A rear cap 222 is mounted to a rear end of the second casing 22. The annular wall 221 further includes a radial hole 225 extending in a direction transverse to the longitudinal direction of the annular wall 221.

The partitioning member 23 includes a first section 231 and a reduced second section 232 projecting outward from a rear side 236 of the first section 231. Preferably, the second section 232 is integrally formed with the first section 231. The partitioning member 23 further includes a through-hole 233 extending through the first second 231 and, the second section 232. A plurality of screw holes 234 are defined in the rear side 236 of the first section 231. The second section 232 includes an outer threaded section 241. The first section 231 further includes a front side 235 that is connected to the rear side 236 by a peripheral wall 237. Preferably, the front side 235 of the first section 231 includes an inner threaded section (not labeled) for engaging with the rear end 213 of the first casing 21.

The through-hole 233 extends from an outer end face 238 of the second section 232 and communicates with an interior of the first casing 21, as shown in FIG. 4. The through-hole 233 includes an enlarged section 239 in the second section 232. A waterproof nut 240 is mounted around the second section 232 and engages with the outer threaded section 241. A plurality of screws 224 are extended through the rear cap 222 and the longitudinal holes 223 into the screw holes 234, thereby engaging the second casing 22 with the partitioning member 23. The second compartment is defined by the second casing 22, the rear cap 222, and the partitioning member 23.

The light source module 3 is mounted in the first casing 21. The light source module 3 can be mounted in a conventional manner. The light source module 3 includes a first circuit board and a plurality of lighting elements. In the illustrated embodiment, the first circuit board is an infrared night vision board (or infrared board) 31 fixed between the sleeve 218 and the first casing 21, and the lighting elements are light-emitting diodes (LEDs) 32.

The shooting module 4 comprises a second circuit board 41 that is secured to a fixing ring 43 (see FIG. 9), which, in turn, is fixed by screws 44 to a plurality of pegs 45 with screw holes (not labeled) in the body 211 of the first casing 21. The fixing ring 43 is preferably obtained by slicing a tubular member formed by aluminum extrusion. The thickness of the fixing ring 43 is selected according to the dimension of a lens 42 of the shooting module 4, so as to locate the lens 42 in a position adjacent to the transparent glass 217. The lens 42 is preferably mounted in a central portion of the second circuit board 41 and extends through the infrared board 31.

The power supply unit 5 is mounted in the second compartment and comprises a line protective device 51, a transformer 52, a power line 53, and a signal line 54. The line protective device 51 includes a waterproof wire holder 511 in the second compartment, a waterproof sleeve 512 extending through the through-hole 233, a waterproof jacket 515, and a tightening member 516. The power line 53 is connected between the transformer 52 and a power source (not shown) for supplying alternating-current power to the transformer 52. The transformer 52 is electrically connected by a first wire 513 to the first circuit board (the infrared board 31) as well as the second circuit board 41, thereby supplying power to the first circuit board and the second circuit board 41. Power is thus supplied to the LEDs 32 on the infrared board 31. It is noted that power supply to the first circuit board 31 and the second circuit board 41 can be arranged in any desired manner. A second wire 514 is electrically connected between the signal line 54 and the second circuit board 41. The image signals as a result of shooting can be transmitted to an external electric device (not shown) electrically connected to the signal line 54. The power line 53 and the signal line 54 are extended through the radial hole 225 for respectively connecting to the power source and the external electric device. The second wire 514 may be deemed as an extension of the signal line 54, and the first wire 513 may be deemed as an extension of the power line 53.

The waterproof jacket 515 is partially received in the enlarged section 239 in the partitioning member 23 and around a section of the first wire 513 and a section of the second wire 514 in the enlarged section 239. The tightening member 516 has a portion sandwiched between the waterproof jacket 515 and a peripheral wall delimiting the enlarged section 239. The waterproof nut 240 is threadedly engaged with the outer threaded section 241 of the second section 232 and exerts an inward force to the tightening member 516, which, in turn, presses * against the waterproof jacket 515, thereby securely clamping the first wire 513 and the second wire 514. Thus, water in the second compartment in the second casing 22 is prevented from entering the first compartment in the first casing 21. The waterproof sleeve 512 mounted in the through-hole 233 in the first section 231 of the partitioning member 23 and around the first wire 513 and the second wire 514 further improves the waterproof effect for preventing water in the second casing 22 from entering the first casing 21. As can be seen from FIG. 4, the waterproof wire holder 511 holds the first wire 513 and the second wire 514 in the second casing 22 together.

By separating the first compartment in the first casing 21 from the second compartment in the second casing 22 by the partitioning member 23, the heat generated by the power supply unit 5 and the moisture are prevented from entering the first compartment in which the shooting module 4 is mounted. Thus, the quality of the shooting module 4 is assured and the life of the shooting module 4 is prolonged, as the heat generated by the power supply unit 5 does not affect the shooting module 4.

Further, the heat generated by the infrared board 31 and the LEDs 32 does not affect the power supply unit 5, allowing normal operation of the power supply unit 5. Further, since there is only one through-hole 233 allowing the first and second wires 513 and 514 to extend through the partitioning member 23, the waterproof effect is improved.

Since the second section 232 of the partitioning member 23 is integrally formed with the rear side 236 of the first section 231 and due to provision of the waterproof jacket 515 and the tightening member 516 as well as coupling of the outer threaded section 241 of the second section 232 and the waterproof nut 240, an excellent waterproof structure is provided.

Since the light source module 3 and the shooting module 4 are located in the first casing 21 that is separated from the second casing 22 in which the power supply unit 5 is mounted, in a case that repair or maintenance of the light source module 3 and/or the shooting module 4 is required, the front cap 212 can be detached without detaching the partitioning member 23 and the rear cap 222. On the other hand, in a case that repair or maintenance of the power supply unit 5 is required, the rear cap 222 can be detached without detaching the partitioning member 23 and the front cap 212. The repair or maintenance of any one of the light source module 3, the shooting module 4, and the power supply unit 5 can be accomplished easily without damaging the other module or unit and without causing deterioration of the waterproof effect for the other module or unit.

In manufacture of the casing unit 2, since the power supply unit 5 is independently mounted in the second casing 22, the length of the first casing 21 can be reduced, cutting in the cost of the first casing 21. Preferably, the wall thickness of the first casing 21 is 7 mm for waterproof consideration. The wall thickness of the second casing 22 can be lowered to 2 mm, plus four cylindrical walls 226 delimiting the longitudinal holes 223 for mounting the screws 224. The material for the second casing 22 is thus saved.

The front cap 212 includes a smooth section 220 behind the inner threaded section 216, and the first casing 21 includes a smooth section 228 behind the outer threaded section 227. Behind the smooth section 228 is an annular groove 230 that receives the waterproof ring 215 and that is followed by another smooth section 229. Through provision of the smooth sections 228 and 229 of the first casing 21, the waterproof ring 215 is prevented from being located in a skew state. Further, an excellent waterproof effect is provided, as the smooth section 220 of the front cap 212 presses against the waterproof ring 215. The waterproof effect is not adversely affected even after repeated detachment. The problem of deterioration of the waterproof effect in the conventional design of washer and screws is avoided.

Figure 5:
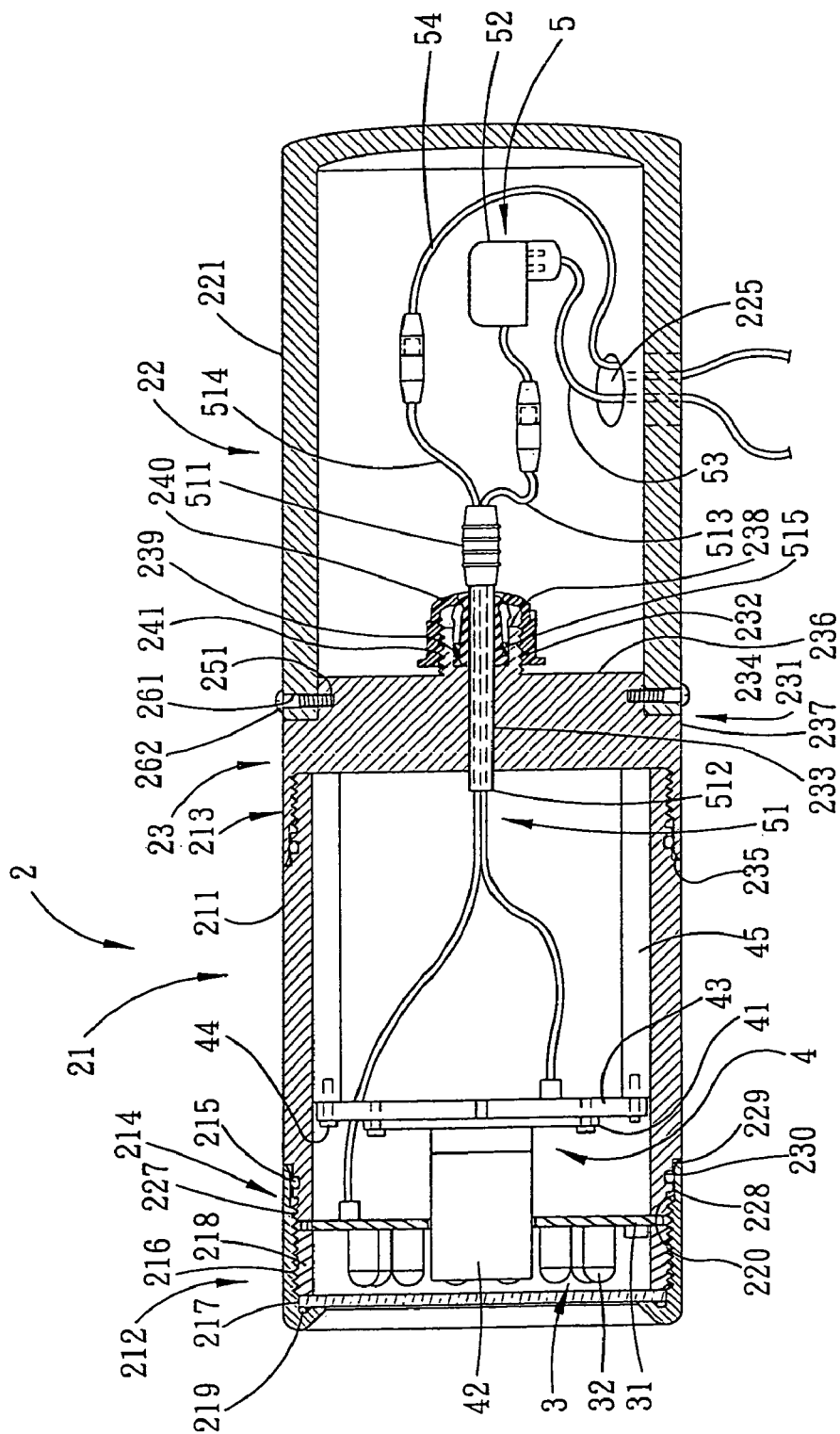
FIG. 5 is a sectional view illustrating a modified embodiment of the camera apparatus in accordance with the present invention.

FIG. 5 shows a modified embodiment of the invention, wherein the longitudinal holes 223 in the embodiment shown in FIGS. 3 and 4 are omitted. In this embodiment, the second casing 22 includes a plurality of radial screw holes 261, and the first section 231 of the partitioning member 23 includes a plurality of radial screw holes 251, with screws 262 extending through the radial screw holes 251 and 261, thereby fixing the second casing 22 to the partitioning member 23.

Figure 6:
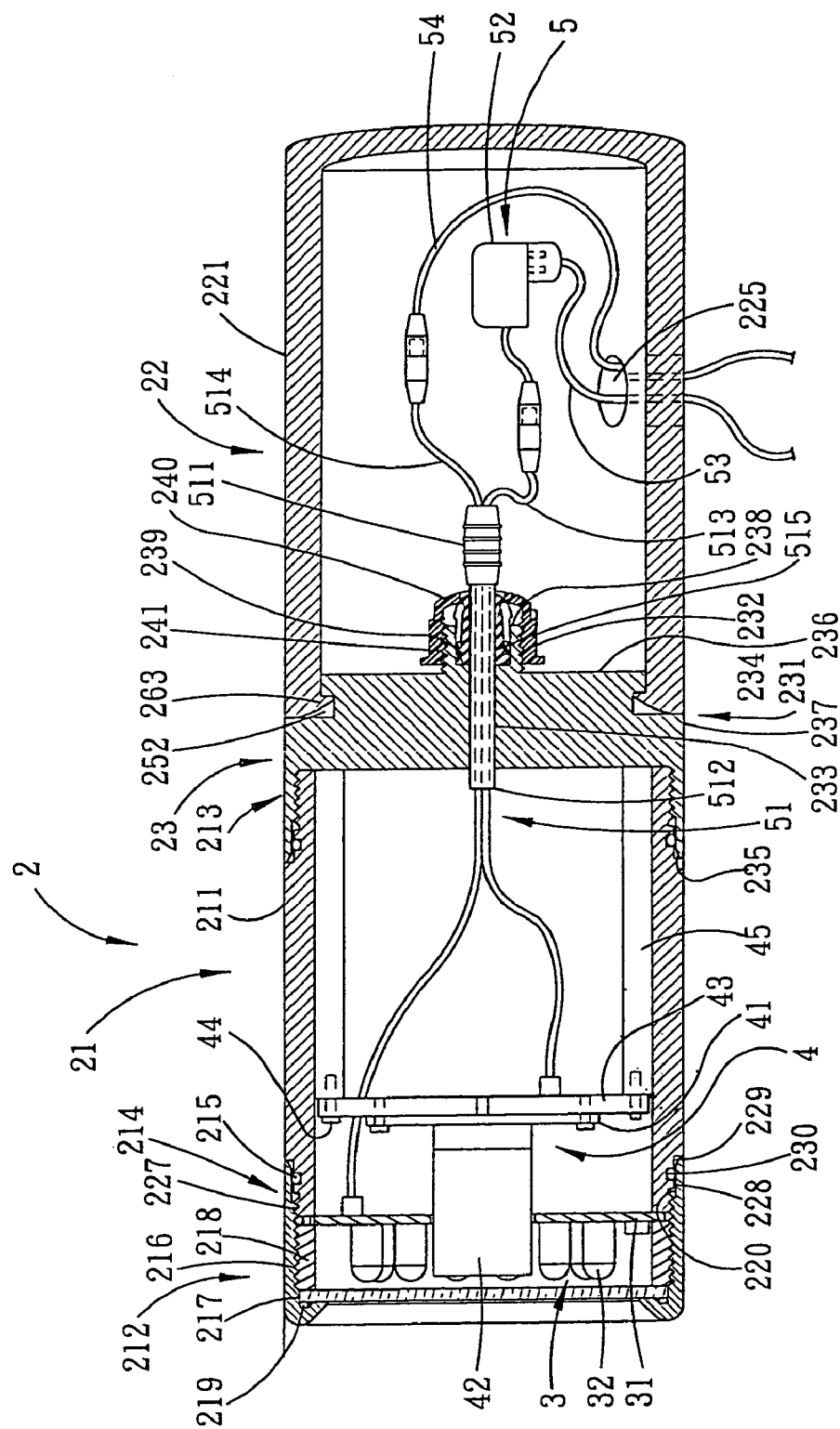
FIG. 6 is a sectional view illustrating another modified embodiment of the camera apparatus in accordance with the present invention.

FIG. 6 shows another modified embodiment of the invention, wherein the longitudinal holes 223 in the embodiment shown in FIGS. 3 and 4 are omitted. In this embodiment, the second casing 22 includes an annular inner flange 263 in an end thereof, and the first section 231 of the partitioning member 23 includes an annular groove 252 for receiving the annular inner flange 263 of the second casing 22, thereby fixing the second casing 22 to the partitioning member 23.

Figure 7:
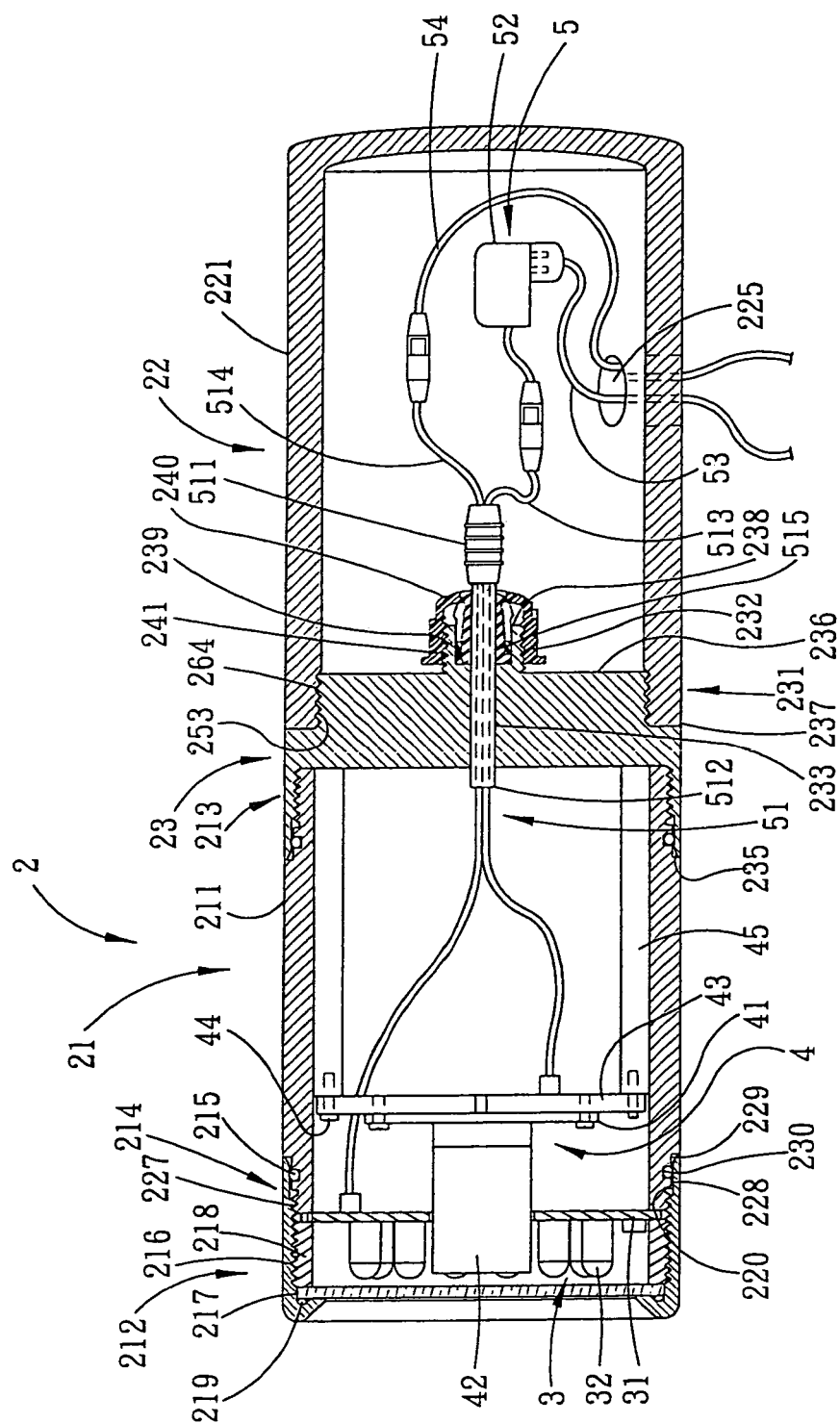
FIG. 7 is a sectional view illustrating a further modified embodiment of the camera apparatus in accordance with the present invention.

FIG. 7 shows a further modified embodiment of the invention, wherein the longitudinal holes 223 in the embodiment shown in FIGS. 3 and 4 are omitted. In this embodiment, the second casing 22 includes an inner threading 264 in an end thereof, and the first section 231 of the partitioning member 23 includes an outer threading 253 for threadedly engaging with the inner threading 264 of the second casing 22, thereby fixing the second casing 22 to the partitioning member 23.

Figure 8:
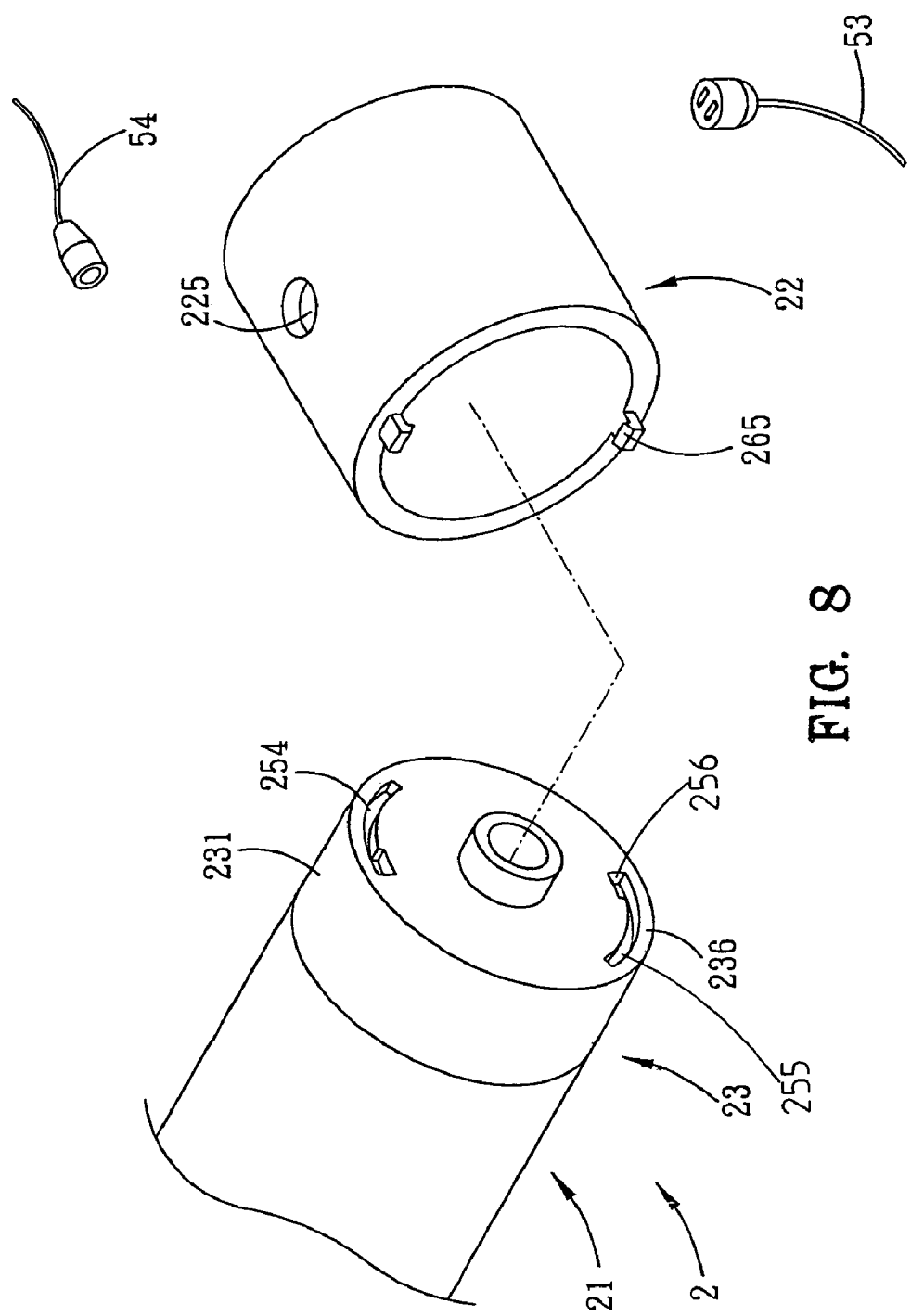
FIG. 8 is an exploded perspective view illustrating still another modified embodiment of the camera apparatus in accordance with the present invention.

FIG. 8 shows still another modified embodiment of the invention, wherein the longitudinal holes 223 in the embodiment shown in FIGS. 3 and 4 are omitted. In this embodiment, the second casing 22 includes two hooks 265 on an end face thereof, and the first section 231 of the partitioning member 23 includes two slots 254 in the side 236 thereof. Each slot 254 includes a relatively narrower section 255 and a relatively wider section 256. Each hook 265 is extended into the relatively wider section 256 of the associated slot 254 and then moved through an angle into the relatively narrower section 255 of the associated slot 254, thereby fixing the second casing 22 to the partitioning member 23. The second casing 22 can be detached from the partitioning member 23 by reverse operation. It is noted that the second casing 22 in each of the embodiments of FIGS. 5 through 8 has a solid rear end.

The partitioning member 23 may include, two through-holes 233, allowing the first wire 513 and the second wire 514 to respectively extend through the through-holes 233. The partitioning member 23 may be omitted. In this case, the casing unit 2 is a single casing having a partitioning wall therein to define a first compartment and a second compartment.

The partitioning member 23 and the second casing 22 can be manufactured by mass production and rapid formation technique, such as aluminum extrusion, punching of thin metal sheet, plastic injection molding, etc.

Although specific embodiments have been illustrated and described, numerous modifications and variations are still possible without departing from the essence of the invention. The scope of the invention is limited by the accompanying claims.

What is claimed is:

1. An infrared night vision camera apparatus comprising:
   a casing unit comprising a first receiving section delimiting a first compartment and a second receiving section delimiting a second compartment separated from the first compartment, the casing unit further including a through-hole for communicating the first compartment with the second compartment;
   a light source module mounted in the first compartment, the light source module comprising a first circuit board and a plurality of lighting elements mounted on the first circuit board;
   a shooting module mounted in the first compartment, the shooting module including a second circuit board and a lens mounted on the second circuit board and extending through the first circuit board; and
   a power supply unit mounted in the second compartment, the power supply unit comprising a power line and a signal line extending through the through-hole, the power line being electrically connected and supplying power to the light source and the shooting module, the signal line being electrically connected to the shooting module;
   heat generated by the power supply unit and moisture in the second compartment being prevented from entering the first compartment;
   wherein the first circuit board is an infrared board and the lighting elements are light-emitting diodes; and
   wherein the casing unit comprises a partitioning member mounted between the first receiving section and the second receiving section for separating the first compartment from the second compartment, with the through-hole being defined in the partitioning member, the partitioning member comprising a first section and a reduced second section integrally formed on a side of the first section, the through-hole extending from the first section through the second section.

2. The infrared night vision camera apparatus as claimed in claim 1, wherein the second receiving section comprises a plurality of longitudinal screw holes, the partitioning member including a plurality of screw holes aligned with the longitudinal screw holes of the second receiving section, the casing unit further including a rear cap mounted to a rear end of the second receiving section, a plurality of screws being extended through the rear cap and the longitudinal screw holes of the second receiving section into the screw holes in the partitioning member.

3. The infrared night vision camera apparatus as claimed in claim 1, wherein the shooting module further comprises a fixing ring securely mounted in the first compartment, and wherein the second circuit board is fixed to the fixing ring.

4. The infrared nightvision camera apparatus as claimed in claim 3, wherein the fixing ring has a size correlated to a length of the lens.

5. The infrared night vision camera apparatus as claimed in claim 1, wherein the first receiving section comprises an open front end, and wherein the first receiving section of the casing unit further comprises a front cap removably attached to the open front end of the first receiving section, with a first waterproof ring being mounted between the front cap and the front end of the first receiving section.

6. The infrared night vision camera apparatus as claimed in claim 5, wherein the second receiving section includes an open rear end, and wherein the casing unit further comprises a rear cap removably attached to the open rear end of the second receiving section.

7. The infrared night vision camera apparatus as claimed in claim 5, wherein the first receiving section comprises a rear end, and wherein the first section of the partitioning member is coupled with the rear end of the first receiving section, with a second waterproof ring being mounted between the rear end of the first receiving section and the first section of the partitioning member.

8. The infrared night vision camera apparatus as claimed in claim 5, wherein the front end of the first receiving section includes an outer threaded section, two smooth sections behind the outer threaded section, and an annular groove between the smooth sections for receiving the first waterproof ring, the front cap including an inner threaded section for threadedly engaging with the outer threaded section of the first receiving section, the front cap further including a smooth section facing the smooth sections of the front receiving section and pressing against the first waterproof ring.

9. The infrared night vision camera apparatus as claimed in claim 1, wherein the second receiving section includes a front end with a plurality of radial screw holes, the first section of the partitioning member including a plurality of radial screw holes, further including a plurality of screws respectively extending through the radial screw holes of the second receiving section into the radial screw holes of the partitioning member.

10. The infrared night vision camera apparatus as claimed in claim 1, wherein the second receiving section includes a front end with an annular inner flange, the first section of the partitioning member including an annular groove for receiving the annular inner flange.

11. The infrared night vision camera apparatus as claimed in claim 1, wherein the second receiving section includes a front end with an inner threading the first section of the partitioning member including an outer threading for threadedly engaging with the inner threading of the second receiving section.

12. The infrared night vision camera apparatus as claimed in claim 1, wherein the second receiving section includes a front end face with two hooks, the first section including a rear side having two slots each having a relatively wider section and a relatively narrower section each said hook being extendable into the relatively wider section of an associated one of the slots and then moved into the relatively narrower section of the associated slot, thereby fixing the second receiving section to the partitioning member.

13. The infrared night vision camera apparatus as claimed in claim 1, wherein the through-hole includes an enlarged section in the second section of the partitioning member, further comprising a waterproof jacket mounted in the enlarged section of the through-hole for holding the power line and the signal line, and a tightening member having at least a portion sandwiched between the waterproof jacket and a peripheral wall delimiting the enlarged section of the through-hole, imparting a force to securely clamping the power line and the signal line.

14. The infrared night vision camera apparatus as claimed in claim 13, wherein the second section of the partitioning member includes an outer threaded section, further comprising a waterproof nut coupled with the outer threaded section of the second section, of the partitioning member, the waterproof nut exerting an inward force to the tightening member.

15. The infrared night vision camera apparatus as claimed in claim 13, further including a waterproof sleeve mounted in a section of the through-hole in the first section of the partitioning member for holding the power line and the signal line.

16. The infrared night vision camera apparatus as claimed in claim 1, wherein the second receiving section includes a radial hole through which the power line and the signal line extend.

17. The infrared night vision camera apparatus as claimed in claim 1, wherein the casing unit includes a first casing limiting the first compartment, a second casing delimiting the second compartment, and a partitioning member mounted between the first casing and the second casing for separating the first compartment from the second compartment.

18. The infrared night vision camera apparatus as claimed in claim 17, wherein the second casing includes a radial hole through which the power line and the signal line extend.

* * * * *